United States Patent
Chen et al.

(10) Patent No.: US 9,892,787 B2
(45) Date of Patent: Feb. 13, 2018

(54) MULTI-TIME PROGRAMMABLE NON-VOLATILE MEMORY CELL AND ASSOCIATED CIRCUITS

(71) Applicant: Chengdu Monolithic Power Systems Co., Ltd., Chengdu (CN)

(72) Inventors: Da Chen, Chengdu (CN); Eric Braun, Mountain View, CA (US)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 15/466,771

(22) Filed: Mar. 22, 2017

(65) Prior Publication Data

US 2017/0287559 A1    Oct. 5, 2017

(30) Foreign Application Priority Data

Apr. 5, 2016   (CN) .......................... 2016 1 0207913

(51) Int. Cl.
| | |
|---|---|
| *G11C 14/00* | (2006.01) |
| *G11C 16/04* | (2006.01) |
| *H01L 29/788* | (2006.01) |
| *G11C 16/14* | (2006.01) |
| *G11C 16/26* | (2006.01) |

(52) U.S. Cl.
CPC ...... *G11C 14/0063* (2013.01); *G11C 16/0408* (2013.01); *G11C 16/14* (2013.01); *G11C 16/26* (2013.01); *H01L 29/7886* (2013.01)

(58) Field of Classification Search
CPC .................................................. G11C 14/0063
See application file for complete search history.

(56) References Cited

U.S. PATENT DOCUMENTS

| | | | |
|---|---|---|---|
| 6,344,990 B1 * | 2/2002 | Matsumiya | G11C 7/02 365/149 |
| 7,020,007 B2 * | 3/2006 | Kwon | G11C 14/00 365/154 |
| 9,245,647 B2 | 1/2016 | Braun | |
| 9,450,052 B1 | 9/2016 | Bergemont | |

* cited by examiner

*Primary Examiner* — Harry W Byrne
*Assistant Examiner* — R Lance Reidlinger
(74) *Attorney, Agent, or Firm* — Perkins Coie LLP

(57) ABSTRACT

A multi-time programmable memory cell has a differential multi-time programmable memory cell and a second-level latch cell. The differential multi-time programmable memory cell provides a first balance signal and a second balance signal, and the second-level latch cell receives the first balance signal and the second balance signal and provides an output signal according to the first balance signal and the second balance signal based on a first latch control signal and a second latch control signal.

19 Claims, 10 Drawing Sheets

MULTI-TIME PROGRAMMABLE NON-VOLATILE MEMORY CELL AND ASSOCIATED CIRCUITS

CROSS-REFERENCE TO RELATED APPLICATION

This application claims the benefit of CN application No. 201610207913.X, filed on Apr. 5, 2016, and incorporated herein by reference.

TECHNICAL FIELD

The present invention relates to electrical circuit, more particularly but not exclusively relates to multi-time programmable memory cell and associated circuits.

BACKGROUND

Multi-time programmable (MTP) storage devices are widely used as non-volatile memory (NVM) when designing integrated circuits recently for an advantage of multi-time programming within endurance limits. One of the multi-time programmable storage devices has a Floating gate Avalanche-injection Metal-Oxide Semiconductor (FAMOS) MTP memory circuit, which usually has a current-sense amplifier configured to compare a memory current signal with a reference current signal. Stored information of the FAMOS MTP memory circuit will be read out according to a comparison result of the current-sense amplifier. However, an additional reference circuit is needed to generate the reference current signal, and the additional reference circuit may mismatch with the FAMOS MTP memory circuit and may induce instability.

Therefore, a MTP memory circuit with higher stability, less silicon area, and lower power dissipated is needed.

SUMMARY

It is one of the objects of the present invention to provide a multi-time programmable memory cell, and associated circuits employing the multi-time programmable memory cell.

One embodiment of the present invention discloses a multi-time programmable cell, comprising: a differential multi-time programmable memory cell, comprising a memory module configured to store data, the differential multi-time programmable memory cell is configured to erase the data stored in the memory module via an erase operation, write the data into the memory module via a write operation, read out the data stored in the memory module and provide a first balance signal and a second balance signal accordingly via a read operation, and load a first load control signal and a second load control signal and provide the first balance signal and the second balance signal via a load operation; and a second-level latch cell, coupled to the differential multi-time programmable memory cell to receive the first balance signal and the second balance signal, and the second-level latch cell is configured to provide an output signal based on the first balance signal, the second balance signal, a first latch control signal and a second latch control signal; wherein the second-level latch cell is configured to generate a sampled signal via sampling the first balance signal and the second balance signal, and the second-level latch cell is configured to provide the output signal based on the sampled signal; and wherein the sampled signal is being stored during when the first latch control signal is at a first state and the second latch control signal is at a second state, and the sampled signal is being held during when the first latch control signal is in the second state and the second latch control signal is in the first state.

Another embodiment of the present invention discloses a multi-time programmable cell, comprising: a memory module, configured to store a data with a multi-time programmable capability; an erase module, configured to erase the data stored in the memory module based on an erase control signal; a write module, configured to store a first programming signal and a second programming signal into the memory module in accordance with a first programming control signal and a second programming control signal, wherein the first programming control signal and the second programming control signal are logically complementary, and the first programming signal and the second programming signal are logically complementary; a read module, configured to read out the data stored in the memory module and provide a first read signal and a second read signal accordingly based on a read control signal, wherein the first read signal and the second read signal are logically complementary; a load module, configured to provide a first load signal and a second load signal according to a first load control signal and a second load control signal, wherein the first load control signal and the second load control signal are logically complementary, and the first load signal and the second load signal are logically complementary; a latch module, configured to provide a first balance signal and a second balance signal in response in part to the first read signal and the second read signal, and in response in part to the first load signal and the second load signal; a balance module, configured to sample the first balance signal and the second balance signal and provide a sampled signal in response to the first balance signal and the second balance signal, wherein the sampled signal is being stored during when a first latch control signal is at a first state and the second latch control signal is at a second state, and wherein the sampled signal is being held during when the first latch control signal is in the second state and the second latch control signal is in the first state; and a single-ended output module, configured to provide an output signal in response to the sampled signal.

Yet another embodiment of the present invention discloses a circuit configured to achieve a function of a D flip-flop, comprising: a logic array, configured to receive a data signal and a clock signal, provide a first load control signal and a second load control signal based on the data signal, and provide a first latch control signal and a second latch control signal based on the clock signal; a differential multi-time programmable memory cell, coupled to the logic array to receive the first load control signal and the second load control signal, the differential multi-time programmable memory cell is configured to provide a first balance signal and a second balance signal in response to the first load control signal and the second load control signal via a load operation; and a second-level latch cell, coupled to the differential multi-time programmable memory cell to receive the first balance signal and the second balance signal, coupled to the logic array to receive the first latch control signal and the second latch control signal, configured to generate a sampled signal in response to the first balance signal and the second balance signal, and configured to provide an output signal in response to the sampled signal; wherein the sampled signal is being stored during when the first latch control signal is at a first state and the second latch control signal is at a second state; and wherein the sampled signal is being held during when the first latch control signal is in the second state and the first latch control signal is in the first state.

Yet another embodiment of the present invention discloses a circuit configured to achieve a function of a register, comprising: a sequence logic unit, configured to receive an address signal, a first signal comprising one of a clock signal and a request signal, and a reading-and-writing enable signal, and is configured to provide an enable control signal, a first latch control signal, a second latch control signal and a load enable signal based on the address signal, the first signal, and the reading-and-writing enable signal; a load logic unit, coupled to the sequence logic unit to receive the load enable signal and configured to receive a data signal, the load logic unit is configured to provide a first load control signal and a second load control signal based on the load enable signal and the data signal; a write logic unit, configured to receive a write signal and an output signal, and provide a first programming control signal and a second programming control signal based on the write signal and the output signal; a differential multi-time programmable memory cell, coupled to the sequence logic unit to receive the enable control signal, coupled to the load logic unit to receive the first load control signal and the second load control signal, coupled to the write logic unit to receive the first programming control signal and the second programming control signal, and the differential multi-time programmable memory cell is configured to provide a first balance signal and a second balance signal based on the enable control signal, the first load control signal, the second load control signal, the first programming control signal, and the second programming signal, wherein the differential multi-time programmable memory cell is capable to erase a stored data via an erase operation, store the data in response to the first programming control signal and the second programming control signal via a write operation, read out the stored data and provide the first balance signal and the second balance signal accordingly via a read operation, and load the first load control signal and the second load control signal and provide the first balance signal and the second balance signal accordingly via a load operation; and a second-level latch cell, coupled to the differential multi-time programmable memory cell to receive the first balance signal and the second balance signal, coupled to the sequence logic unit to receive the first latch control signal and the second latch control signal, configured to generate a sampled signal in response to the first balance signal and the second balance signal, and configured to provide the output signal based on the sampled signal; wherein the sampled signal is being stored during when the first latch control signal is at a first state and the second latch control signal is at a second state; and wherein the sampled signal is being held during when the first latch control signal is in the second state and the first latch control signal is in the first state.

BRIEF DESCRIPTION OF THE DRAWINGS

Non-limiting and non-exhaustive embodiments are described with reference to the following drawings.

The use of the same reference label in different drawings indicates the same or like components.

DETAILED DESCRIPTION

In the present application, numerous specific details are provided, such as examples of circuits, components, and methods, to provide a thorough understanding of embodiments of the invention. These embodiments are exemplary, not to confine the scope of the invention. Persons of ordinary skill in the art will recognize, however, that the invention can be practiced without one or more of the specific details. In other instances, well-known details are not shown or described to avoid obscuring aspects of the invention. Some phrases are used in some exemplary embodiments. However, the usage of these phrases is not confined to these embodiments.

Several embodiments of the present invention are described below with reference to a multi-time programmable non-volatile memory cell and associated circuits employing the multi-time programmable non-volatile memory cell.

Figure 1:
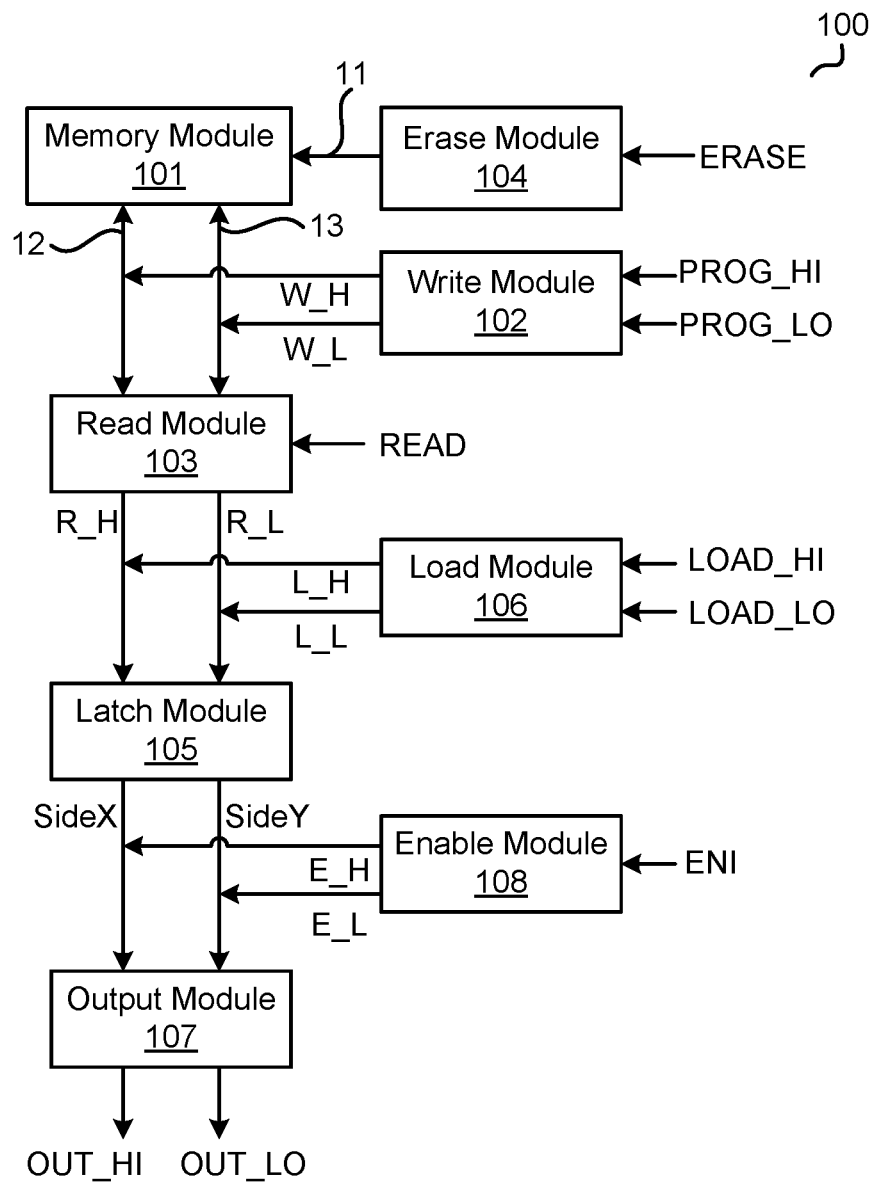
FIG. 1 illustrates a block diagram of a differential multi-time programmable non-volatile memory cell 100 according to an embodiment of the present invention.

FIG. 1 illustrates a block diagram of a differential multi-time programmable non-volatile memory cell 100 with one-bit according to an embodiment of the present invention. Referring to FIG. 1, differential multi-time programmable non-volatile memory cell 100 comprises a memory module 101, a write module 102, a read module 103, and an erase module 104. Memory module 101 which can be multi-time programmed has a terminal 11, a terminal 12, and a terminal 13. Terminal 11 of memory module 101 is coupled to erase module 104, and memory module 101 performs an erase operation under the control of erase module 104. Terminal 12 and terminal 13 of memory module 101 are coupled to both write module 102 and read module 103, and memory module 101 performs a write operation under the control of write module 102 and performs a read operation under the control of read module 103.

Write module 102 is configured to write data into memory module 101 in accordance with a programming control signal PROG_HI and a programming control signal PROG_LO. In one embodiment, write module 102 comprises a first input terminal, a second input terminal, a first output terminal, and a second output terminal, the first input terminal of write module 102 is configured to receive programming control signal PROG_HI, the second input terminal of write module 102 is configured to receive programming control signal PROG_LO, the first output terminal of write module 102 is configured to provide a programming signal W_H to terminal 12 of memory module 101, and the second output terminal of write module 102 is configured to provide a programming signal W_L to terminal 13 of memory module 101. In one embodiment, programming control signal PROG_H and programming control signal PROG_L are differential signals, namely logical complementary signals. For example, programming control signal PROG_H is at logic high, programming control signal PROG_L is at logic low, and vice versa. In one embodiment, programming signal W_H and programming signal W_L are differential signals, namely logical complementary signals. For example, programming signal W_H is at logic high, programming signal W_L is at logic low, and vice versa.

Read module 103 is configured to read out the data stored in memory module 101 in accordance with a read control signal READ. In one embodiment, read module 103 comprises a first input terminal, a second input terminal, a third input terminal, a first output terminal, and a second output terminal. The first input terminal and the second input terminal of read module 103 are respectively coupled to terminal 12 and terminal 13 of memory module 101 to receive a differential signal from memory module 101, the third input terminal of read module 103 is configured to receive read control signal READ, and the first output terminal of read module 103 is configured to provide read signal R_H and the second output terminal of read module 103 is configured to provide read signal R_L based on the data stored in memory module 101. In one embodiment, read signal R_H and read signal R_L are differential signals, namely logical complementary signals. For example, read signal R_H is at logic high, read signal R_L is at logic low, and vice versa.

Erase module 104 is configured to erase the data stored in memory module 101 in accordance with an erase control signal ERASE. In one embodiment, erase module 104 comprises an input terminal and an output terminal, wherein the input terminal of erase module 104 is configured to receive the erase control signal ERASE, and the output terminal of erase module 104 is coupled to terminal 11 of memory module 101 to erase the data stored in memory module 101 based on the erase control signal ERASE.

In one embodiment, during the erase operation, write module 102 and read module 103 are non-activated, namely the write operation and the read operation are prohibited. And once erase control signal ERASE is activated, e.g., at logic high, the data stored in memory module 101 is erased. In one embodiment, during the write operation, erase control signal ERASE and read control signal READ are non-activated, namely read module 103 and erase module 104 are non-activated, and the read operation and the erase operation are prohibited. Once programming control signal PROG_H and programming control signal PROG_L are activated, the data is stored into memory module 101 via write module 102 in accordance with programming control signal PROG_H and programming control signal PROG_L. In one embodiment, during the read operation, erase control signal ERASE, programming control signal PROG_H and programming control signal PROG_L are non-activated, namely write module 102 and erase module 104 are non-activated, and the write operation and the erase operation are prohibited. Once read control signal READ is activated, read module 103 is configured to read out the data stored in memory module 101.

In one embodiment, differential multi-time programmable non-volatile memory cell 100 further comprises a latch module 105, a load module 106, an output module 107, and an enable module 108.

In accordance with a load control signal LOAD_HI and a load control signal LOAD_LO, load module 106 is configured to provide data to latch module 105. In one embodiment, load module 106 has a first input terminal configured to receive load control signal LOAD_HI, a second input terminal configured to receive load control signal LOAD_LO, a first output terminal configured to provide a load signal L_H, and a second output terminal configured to provide a load signal L_L. In one embodiment, load control signal LOAD_HI and load control signal LOAD_LO are differential signals, namely logical complementary signals. For example, load control signal LOAD_HI is at logic high, load control signal LOAD_LO is at logic low, and vice versa. In one embodiment, load signal L_H and load signal L_L are differential signals, namely logical complementary signals. For example, load signal L_H is at logic high, load signal L_L is at logic low, and vice versa.

Latch module 105 is configured to provide a latch signal SideX and a latch signal SideY either in accordance with read signal R_H and read signal R_L or in accordance with load signal L_H and load signal L_L. In one embodiment, latch module 105 comprises a first input terminal, a second input terminal, a first output terminal configured to provide latch signal SideX, and a second output terminal configured to provide latch signal SideY, wherein the first input terminal of latch module 105 is configured to receive read signal R_H from read module 103 or receive load signal L_H from load module 106, and the second input terminal of latch module 105 is configured to receive read signal R_L from read module 103 or receive load signal L_L from load module 106. In one embodiment, latch signal SideX and latch signal SideY are differential signals, namely logical complementary signals. For example, latch signal SideX is at logic high, latch signal SideY is at logic low, and vice versa. In one embodiment, when read signal READ is activated and load control signals LOAD_HI and LOAD_LO are non-activated, the data stored in memory module 101 is read out to latch module 105 via read module 103. In another embodiment, when load control signals LOAD_HI and LOAD_LO are activated and read signal READ is non-activated, data is loaded to latch module 105 to provide latch signals SideX and SideY via load module 106 in accordance with load control signals LOAD_HI and LOAD_LO.

Enable module 108 is configured to set a default state for an output signal OUT_HI and an output signal OUT_LO. In one embodiment, enable module 108 comprises an input terminal configured to receive an enable control signal ENI, a first output terminal configured to provide an enable signal E_H, and a second output terminal configured to provide an enable signal E_L.

Output module 107 is configured to provide output signal OUT_HI and output signal OUT_LO either in accordance with latch signal SideX and latch signal SideY, or in accordance with enable signal E_H and enable signal E_L. In one embodiment, output module 107 comprises a first input terminal, a second input terminal, a first output terminal configured to provide output signal OUT_HI, and a second output terminal configured to provide output signal OUT_LO, wherein the first input terminal of output module 107 is coupled to latch module 105 and enable module 108 to receive either latch signal SideX or enable signal E_H, and the second input terminal of output module 107 is coupled to latch module 105 and enable module 108 to receive either latch signal SideY or enable signal E_L.

In one embodiment, when differential multi-time programmable non-volatile memory cell 100 is powered up, a reset operation is executed to set output signals OUT_HI and OUT_LO the default state (e.g., OUT_HI=OUT_LO="1") before any other operation by asserting enable control signal ENI, while de-asserting load control signals LOAD_HI and LOAD_LO, read control signal READ, and programming control signals PROG_HI and PROG_LO, for one example, ENI="1", LOAD_HI="0", LOAD_LO="0", READ="0", PROG_HI="0", and PRGO_LO="0".

In one embodiment, the load operation is executed when enable control signal ENI is inactivated and followed by load control signal LOAD_HI and load control signal LOAD_LO being activated. Load module 106 is operated to provide load signal L_H and load signal L_L to latch module 105, and output module 107 is configured to provide output signal OUT_HI and output signal OUT_LO in accordance with load signal L_H and load signal L_L.

In one embodiment, memory module 101 is initially unprogrammed. The write operation is executed when programming control signal PROG_HI and programming control signal PROG_LO are activated and when read control signal READ, load control signal LOAD_HI and load control signal LOAD_LO are non-activated, memory module 101 is programmed in accordance with programming signal W_H and programming signal W_L. In one embodiment, the erase operation is executed before the write operation to erase the data stored in memory module 101 and to resume memory module 101 initially unprogrammed.

In one embodiment, the read operation is executed when read control signal READ is activated and when load control signal LOAD_HI, load control signal LOAD_LO, programming control signal PROG_HI, and programming control signal PROG_LO are non-activated, the data stored in memory module 101 is read out to latch module 105, and then output signal OUT_HI and output signal OUT_LO are provided accordingly via output module 107.

Figure 2:
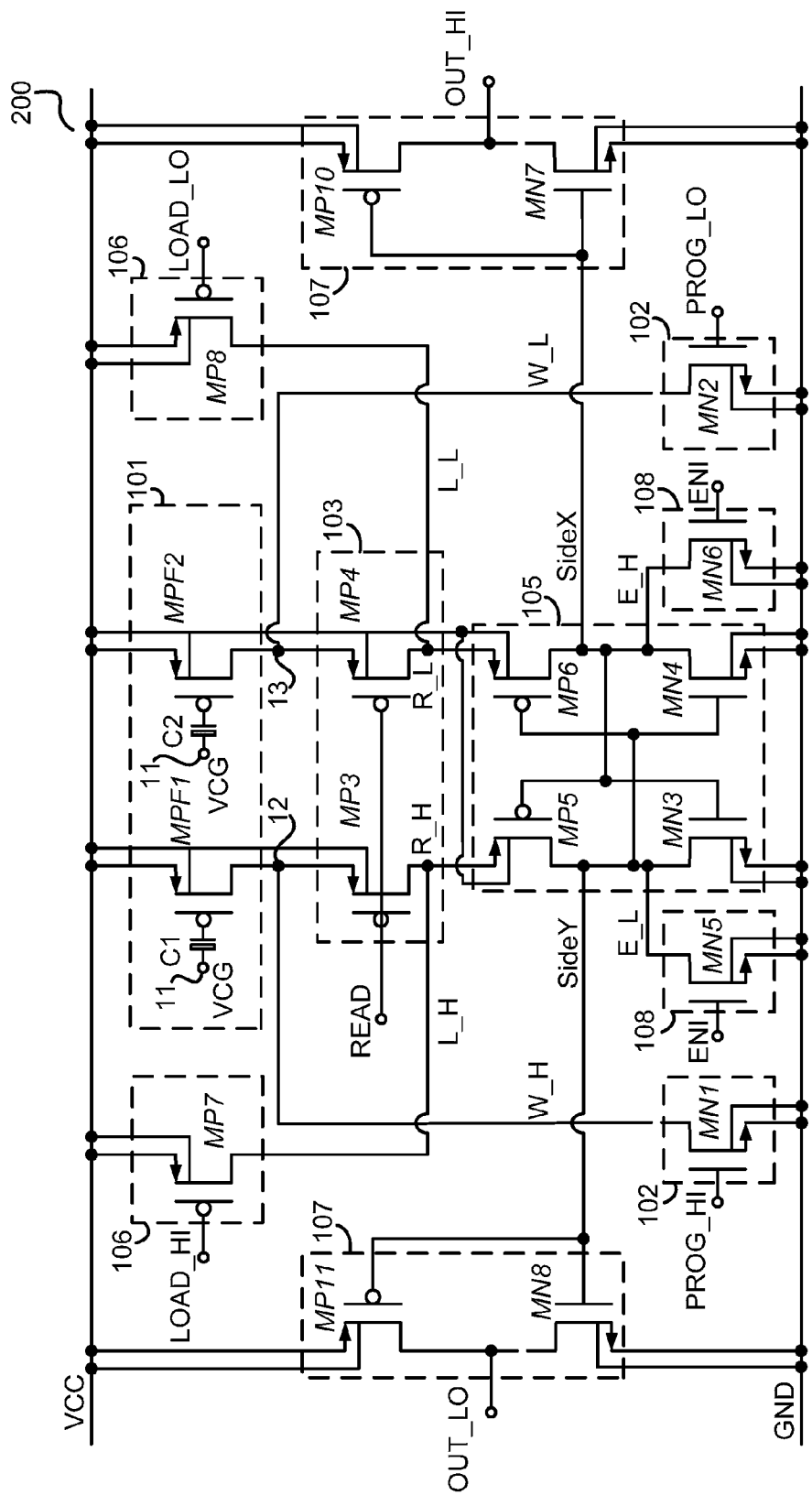
FIG. 2 schematically illustrates a multi-time programmable memory cell 200 according to an embodiment of the present invention.

FIG. 2 schematically illustrates a multi-time programmable memory cell 200 according to an embodiment of the present invention.

In one embodiment, memory module 101 has a differential structure comprising a floating gate avalanche-injection metal-oxide semiconductor (FAMOS) MPF1 and a FAMOS MPF2. FAMOS MPF1 and FAMOS MPF2 respectively have a source, a drain and a floating gate. The source of FAMOS MPF1 and the source of FAMOS MPF2 are coupled together to receive a supply voltage VCC, the drain of FAMOS MPF1 is utilized as terminal 12 of memory module 101, the drain of FAMOS MPF2 is utilized as terminal 13 of memory module 101. The floating gate of FAMOS MPF1 is coupled to one terminal of an erase capacitor C1, the floating gate of FAMOS MPF2 is coupled to one terminal of an erase capacitor C2, the other terminal of erase capacitor C1 and the other terminal of erase capacitor C2 are coupled together as terminal 11 of memory module 101. In the embodiment shown in FIG. 2, FAMOS MPF1 and FAMOS MPF2 are P type for illustrative purposes. However, one of ordinary skill in the art to which the invention pertains should understand that FAMOS MPF1 and FAMOS MPF2 may be substituted by N type switches.

In one embodiment, terminal 11 of memory module 101 receives an erase voltage VCG, and the erase operation is executed by controlling erase voltage VCG. For example, when erase control signal ERASE is activated, erase voltage VCG is controlled to erase the data stored in the memory module 101 via enlarging a voltage difference between supply voltage VCC and erase voltage VCG, for example the voltage difference between supply voltage VCC and erase voltage VCG equals tripled supply voltage VCC.

In one embodiment, write module 102 has a differential structure comprising an N-type metal oxide semiconductor field effect transistor (NMOS) MN1 and an NMOS MN2. Both NMOS MN1 and NMOS MN2 respectively have a drain, a source and a gate. The source of NMOS MN1 and the source of NMOS MN2 are coupled to a logic ground GND, the drain of NMOS MN1 utilized as the first output terminal of write module 102 is coupled to the drain of FAMOS MPF1 to provide programming signal W_H, the drain of NMOS MN2 utilized as the second output terminal of write module 102 is coupled to the drain of FAMOS MPF2 to provide programming signal W_L, the gate of NMOS MN1 utilized as the first input terminal of write module 102 is configured to receive programming control signal PROG_HI, and the gate of NMOS MN2 utilized as the second input terminal of write module 102 is configured to receive programming control signal PROG_LO.

In one embodiment, read module 103 has a differential structure comprising a P-type metal oxide semiconductor field effect transistor (PMOS) MP3 and a PMOS MP4. Both PMOS MP3 and PMOS MP4 respectively have a source, a drain and a gate. The source of PMOS MP3 utilized as the first input terminal of read module 103 is coupled to the drain of FAMOS MPF1, the source of PMOS MP4 utilized as the second input terminal of read module 103 is coupled to the drain of FAMOS MPF2, the gate of PMOS MP3 and the gate of PMOS MP4 are coupled together to receive read control signal READ, the drain of PMOS MP3 utilized as the first output terminal of read module 103 is configured to provide read signal R_H, and the drain of PMOS MP4 utilized as the second output terminal of read module 103 is configured to provide read signal R_L.

In one embodiment, load module 106 has a differential structure comprising a PMOS MP7 and a PMOS MP8. Both PMOS MP7 and PMOS MP8 respectively have a drain, a source and a gate. The drain of PMOS MP7 utilized as the first output terminal of load module 106 is coupled to the drain of PMOS MP3, the drain of PMOS MP8 utilized as the second output terminal of load module 106 is coupled to the drain of PMOS MP4. The source of PMOS MP7 and the source of PMOS MP8 are coupled together to receive supply voltage VCC, the gate of PMOS MP7 utilized as the first input terminal of load module 106 is configured to receive load control signal LOAD_HI, and the gate of PMOS MP8 utilized as the second input terminal of load module 106 is configured to receive load control signal LOAD_LO.

In one embodiment, latch module 105 is configured to latch load signal L_H and load signal L_L provided by load module 106, and is configured to latch read signal R_H and read signal R_L provided by read module 103. In one embodiment, latch module 105 comprises a PMOS MP5, a PMOS MP6, an NMOS MN3 and an NMOS MN4. PMOS MP5, PMOS MP6, NMOS MN3 and NMOS MN4 respectively have a drain, a source and a gate. The source of PMOS MP5 utilized as the first input terminal of latch module 105 is coupled to the drain of PMOS MP3 and the drain of PMOS MP7 to receive read signal R_H and/or load signal L_H, the source of PMOS MP6 utilized as the second input terminal of latch module 105 is coupled to the drain of PMOS MP4 and the drain of PMOS MP8 to receive read signal R_L and/or load signal L_L. The gate of PMOS MP5, the gate of NMOS MN3, the drain of PMOS MP6 and the drain of NMOS MN4 are coupled together as the first output terminal of latch module 105 to provide latch signal SideX. The gate of PMOS MP6, the gate of NMOS MN4, the drain of PMOS MP5, and the drain of NMOS MN3 are coupled together as the second output terminal of latch module 105 to provide latch signal SideY. And the source of NMOS MN3 and the source of NMOS MN4 are coupled to logic ground GND.

In one embodiment, enable module 108 has a differential structure comprising an NMOS MN5 and an NMOS MN6, both NMOS MN5 and NMOS MN6 respectively have a drain, a source and a gate. The drain of NMOS MN6 utilized as the first output terminal of enable module 108 is configured to provide enable signal E_H, the drain of NMOS MN5 utilized as the second output terminal of enable module 108 is configured to provide enable signal E_L, the source of NMOS MN5 and the source of NMOS MN6 are coupled to logic ground GND, the gate of NMOS MN5 and the gate of NMOS MN6 are coupled together as the input terminal of enable module 108 to receive enable control signal ENI.

In one embodiment, output module 107 comprises a first buffer comprising a PMOS MP10 and an NMOS MN7, a second buffer comprising a PMOS MP11 and an NMOS MN8. PMOS MP10, PMOS MP11, NMOS MN7 and NMOS MN8 respectively have a drain, a source and a gate. The source of PMOS MP11 and the source of PMOS MP10 are coupled to supply voltage VCC, the source of NMOS MN8 and the source of NMOS MN7 are coupled to logic ground GND, the gate of PMOS MP10 and the gate of NMOS MN7 coupled together as the first input terminal of output module 107 are coupled to latch module 105 and/or enable module 108 to receive latch signal SideX and/or enable signal E_H, the gate of PMOS MP11 and the gate of NMOS MN8 coupled together as the second input terminal of output module 107 are coupled to latch module 105 and/or enable module 108 to receive latch signal SideY and/or enable signal E_L, the drain of PMOS MP10 and the drain of NMOS MN7 coupled together as the first output terminal of output module 107 are configured to provide output signal OUT_HI, and the drain of PMOS MP11 and the drain of NMOS MN8 coupled together as the second output terminal of output module 107 are configured to provide output signal OUT_LO.

In one embodiment, the reset operation is executed firstly when multi-time programmable memory cell 200 is powered up. In the embodiment shown in FIG. 2, the reset operation is executed when enable control signal ENI is activated, e.g., at logic high, NMOS MN5 and NMOS MN6 are turned ON, enable signal E_H and enable signal E_L are at logic low. While load control signal LOAD_HI, load control signal LOAD_LO, and read control signal READ are at logic high to maintain non-activated, and programming control signal PROG_HI and programming control signal PROG_LO are at logic low to maintain non-activated. PMOS MP10 is turned ON and NMOS MN7 is turned OFF in response to low logical enable signal E_H and low logical enable signal E_L, and output signal OUT_HI is set at logic high accordingly. PMOS MP11 is turned ON and NMOS MN8 is turned OFF in response to low logical enable signal E_H and low logical enable signal E_L, and output signal OUT_LO is set at logic high accordingly. In another embodiment, output signal OUT_HI and output signal OUT_LO may be set at logic low by the reset operation.

In one embodiment, load control signal LOAD_HI being at logic low and load control signal LOAD_LO being at logic high are activated to execute the load operation, PMOS MP7 is turned ON, PMOS MP8 is turned OFF, latch module 105 receives high logical load signal L_H and low logical load signal L_L, and then provides low logical latch signal SideX and high logical latch signal SideY. Accordingly, output signal OUT_HI is at logic high and output signal OUT_LO is at logic low. In another embodiment, load control signal LOAD_HI being at logic high and load control signal LOAD_LO being at logic low are activated to execute the load operation, PMOS MP7 is turned OFF, PMOS MP8 is turned ON, latch module 105 receives low logical load signal L_H and high logical load signal L_L, and then provides high logical latch signal SideX and low logical latch signal SideY. Accordingly, output signal OUT_HI is at logic low and output signal OUT_LO is at logic high.

In one embodiment, during the write operation, read control signal READ, load control signal LOAD_HI and load control signal LOAD_LO are respectively at logic high to be non-activated. In one embodiment, programming control signal PROG_HI being at logic high and programming control signal PROG_LO being at logic low are activated to execute the write operation, FAMOS MPF1 and FAMOS MPF2 are programmed via write module 102, that is NMOS MN1 is turned ON to program FAMOS MPF1 at high logic state, and NMOS MN2 is turned OFF to program FAMOS MPF2 at low logic state. In another embodiment, programming control signal PROG_HI being at logic low and programming control signal PROG_LO being at logic high are activated to execute the write operation, FAMOS MPF1 and FAMOS MPF2 are programmed via write module 102, that is NMOS MN1 is turned OFF to program FAMOS MPF1 at low logic state, and NMOS MN2 is turned ON to program FAMOS MPF2 at high logic state.

In one embodiment, during the read operation, programming control signal PROG_HI and programming control signal PROG_LO are non-activated, e.g., at logic low, to deactivate write module 102, and both NMOS MN1 and NMOS MN2 are turned OFF. Load control signal LOAD_HI and load control signal LOAD_LO are non-activated, e.g., at logic high, to deactivate load module 106, and both PMOS MP7 and PMOS MP8 are turned OFF. When read control signal READ is activated, read module 103 reads out the state of FAMOS MPF1 and provides read signal R_H accordingly, and reads out the state of FAMOS MPF2 and provides read signal R_L accordingly. In one embodiment, read control signal READ is an analog signal, and read control signal READ being activated comprises being less than supply voltage VCC to turn ON PMOS MP3 and PMOS MP4. For example, FAMOS MPF1 was programmed at the state "1", FAMOS MPF2 was programmed at the state "0", and when read control signal READ is activated, read signal R_H is at logic high and read signal R_L is at logic low, latch module 105 provides latch signal SideX at logic low and latch signal SideY at logic high, thus output signal OUT_HI becomes at logic high and output signal OUT_LO becomes at logic low accordingly.

Figure 3:
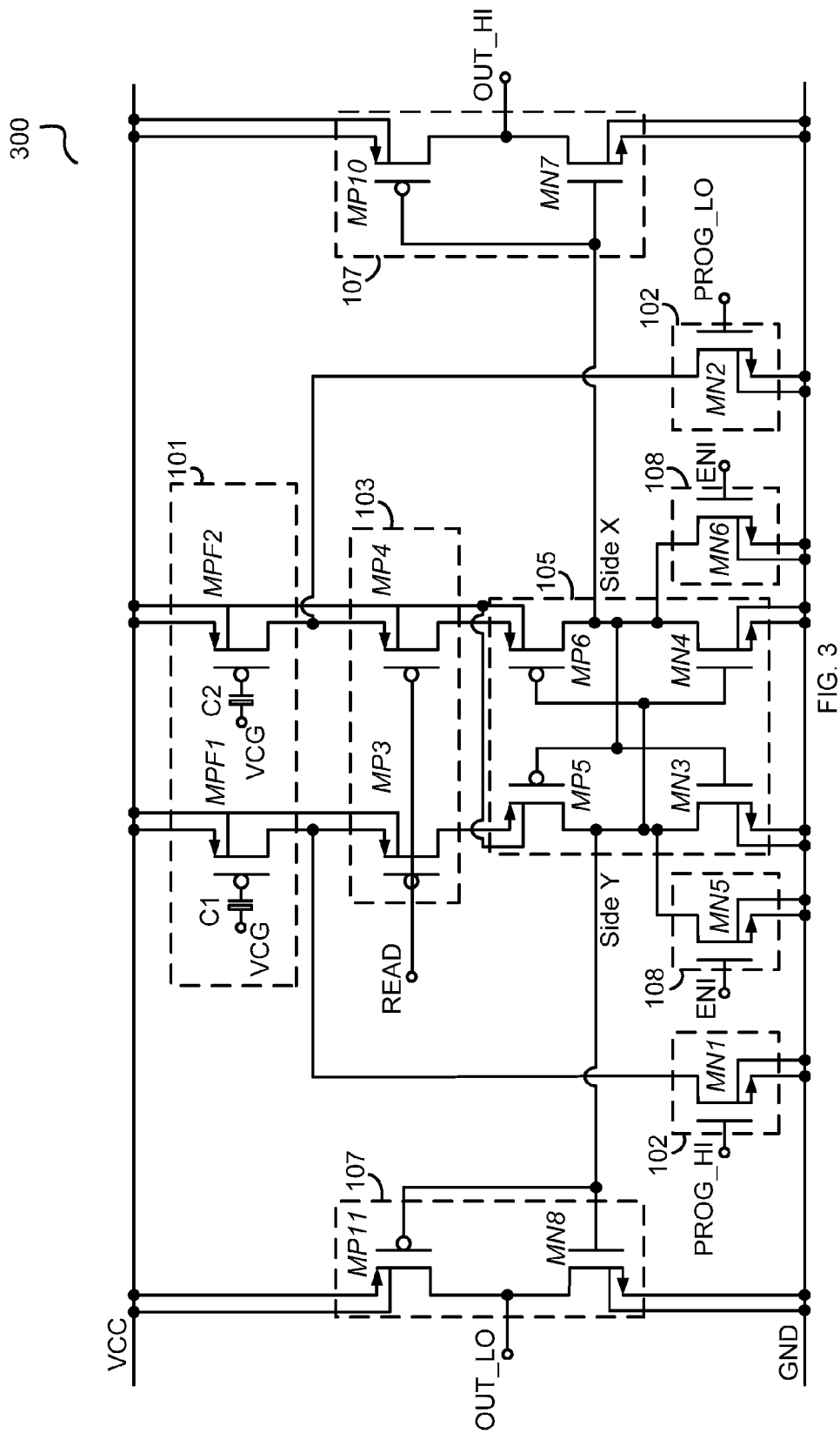
FIG. 3 schematically illustrates a multi-time programmable memory cell 300 according to an embodiment of the present invention.

FIG. 3 schematically illustrates a multi-time programmable memory cell 300 according to an embodiment of the present invention. Multi-time programmable memory cell 300 is same as multi-time programmable memory cell 200, excepting that multi-time programmable memory cell 300 does not include load module 106.

Figure 4:
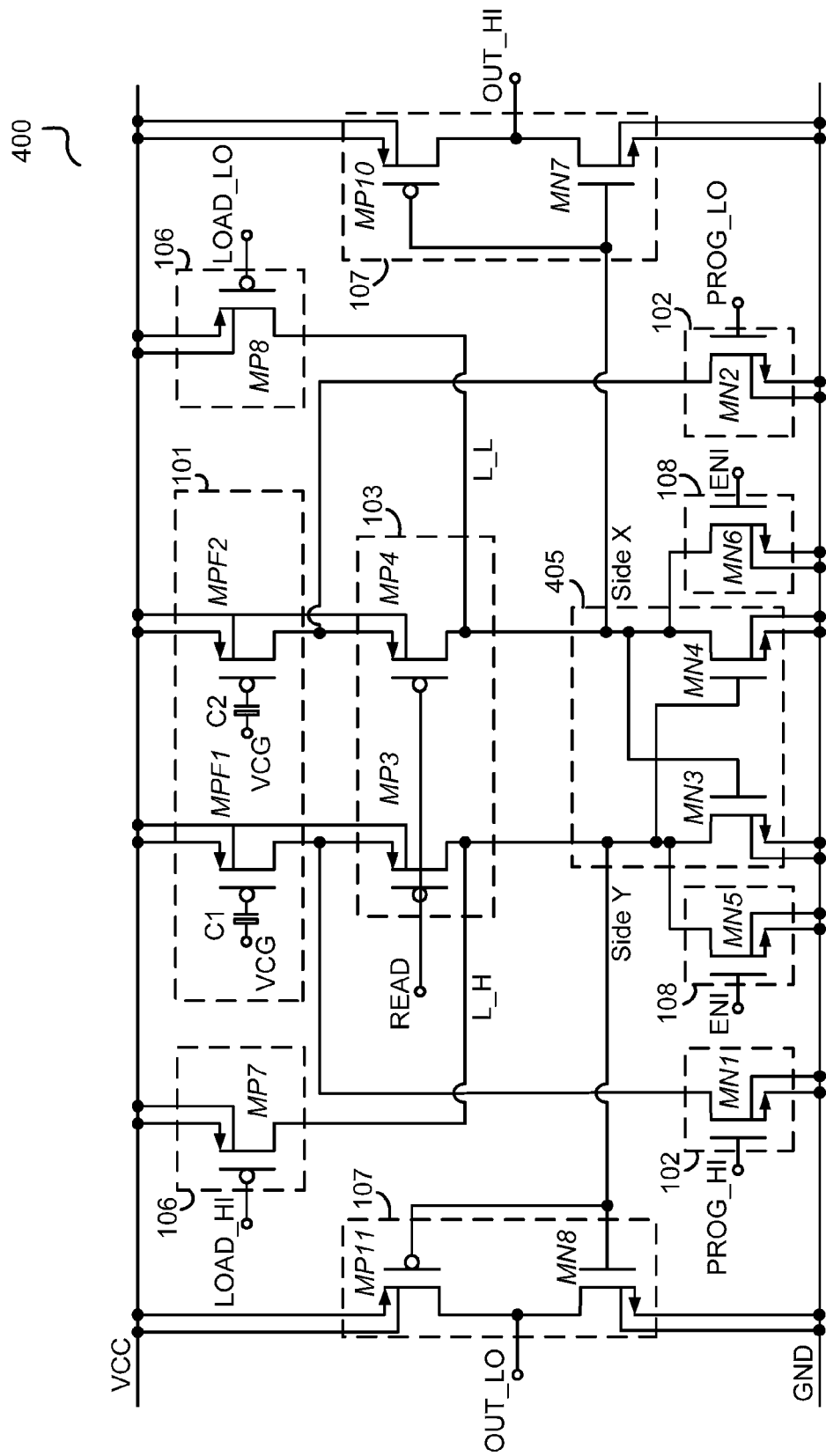
FIG. 4 schematically illustrates a multi-time programmable memory cell 400 according to an embodiment of the present invention.

FIG. 4 schematically illustrates a multi-time programmable memory cell 400 according to an embodiment of the present invention. Multi-time programmable memory cell 400 has different latch module 405 compared with multi-time programmable memory cell 200. Latch module 405 is configured to latch load signal L_H and load signal L_L provided by load module 106. In one embodiment, latch module 406 comprises NMOS MN3 and NMOS MN4. The drain of NMOS MN3 and the gate of NMOS MN4 utilized as a first input terminal of latch module 405 are coupled to the drain of PMOS MP3 and the drain of PMOS MP7 to receive read signal R_H and/or load signal L_H, while the drain of NMOS MN3 and the gate of NMOS MN4 are also utilized as a second output terminal of latch module 405 to provide latch signal SideY. The drain of NMOS MN4 and the gate of NMOS MN3 utilized as a second input terminal of latch module 405 are coupled to the drain of PMOS MP4 and the drain of PMOS MP8 to receive read signal R_L and/or load signal L_L, while the drain of NMOS MN4 and the gate of NMOS MN3 are also utilized as a first output terminal of latch module 405 to provide latch signal SideX. The source of NMOS MN3 and the source of NMOS MN4 are coupled to logic ground GND.

Figure 5:
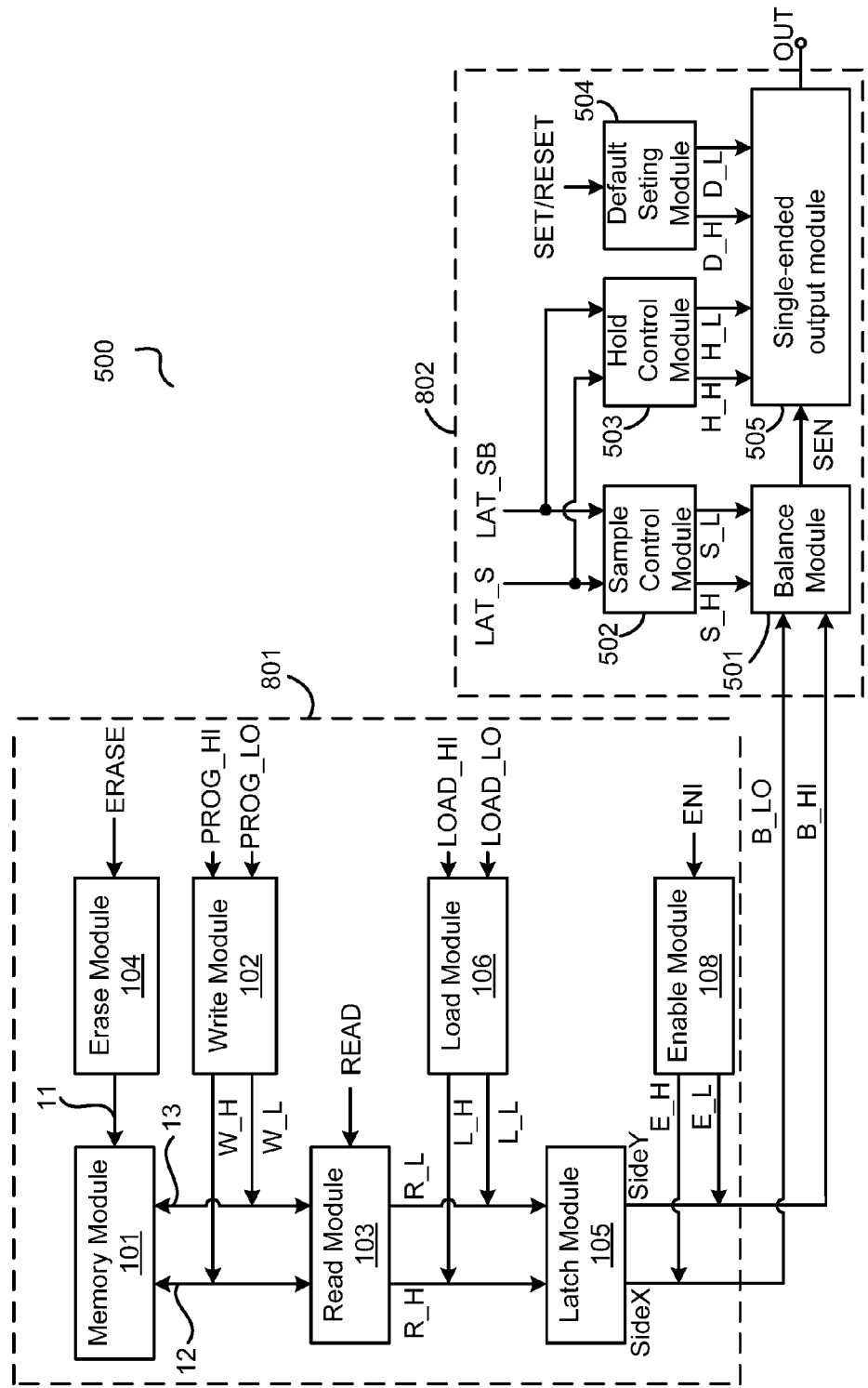
FIG. 5 illustrates a block diagram of a multi-time programmable non-volatile memory cell 500 according to another embodiment of the present invention.

FIG. 5 illustrates a block diagram of a multi-time programmable non-volatile memory cell 500 with one-bit according to another embodiment of the present invention. Multi-time programmable non-volatile memory cell 500 comprises a differential MTP cell 801 and a second-level latch cell 802, wherein differential MTP cell 801 comprises memory module 101, write module 102, read module 103, erase module 104, and latch module 105, and wherein second level latch cell 802 comprises a balance module 501, a sample control module 502, a hold control module 503, a default setting module 504, and a single-ended output module 505. In one embodiment, differential MTP cell 801 is configured to erase the data stored in memory module 101 via the erase operation, to program memory module 101, i.e., write the data into memory module 101 via the write operation, to provide a balance signal B_HI and a balance signal B_LO by reading out the data stored in memory module 101 via the read operation, to provide balance signal B_HI and balance signal B_LO according to load control signal LOAD_HI and load control signal LOAD_LO via the load operation. In one embodiment, second-level latch cell 802 is configured to provide output signal OUT based on balance signal B_HI and balance signal B_LO under control of a latch control signal LAT_S and a latch control signal LAT_SB. In one embodiment, differential MTP cell 801 further comprises load module 106 and/or enable module 108. Memory module 101, write module 102, read module 103, erase module 104, latch module 105, load module 106, and enable module 108 have been detailed described above. In one embodiment, multi-time programmable non-volatile memory cell 500 may be utilized as a D flip-flop.

In the embodiment shown in FIG. 5, differential MTP cell 801 is configured to provide balance signal B_LO according to latch signal SideX or enable signal E_H, and provide balance signal B_HI according to latch signal SideY or enable signal E_L. In one embodiment, balance module 501 is configured to provide sampled signal SEN via sampling balance signal B_HI and balance signal B_LO, and single-ended output module 505 is configured to provide output signal OUT according to sampled signal SEN. In one embodiment, sampled signal SEN is being stored when latch control signal LAT_S is at a first state and latch control signal LAT_SB is at a second state; and sampled signal SEN is being held when latch control signal LAT_S is in the second state and latch control signal LAT_SB is in the first state.

Balance module 501 is configured to balance differential output load of balance signal B_HI and balance signal B_LO for ensuring correctness of output signal OUT. In one embodiment, balance module 501 has a first input terminal coupled to latch module 105 and/or enable module 108 to receive balance signal B_HI, a second input terminal coupled to latch module 105 and/or enable module 108 to receive balance signal B_LO, a third input terminal configured to receive a sample control signal S_H, a fourth input terminal configured to receive a sample control signal S_L, and an output terminal configured to provide sampled signal SEN according to balance signal B_HI and balance signal B_LO under control of sample control signal S_H and sample control signal S_L.

Sample control module 502 controls balance module 501 to sample balance signal B_HI and balance signal B_LO in accordance with latch control signal LAT_S and latch control signal LAT_SB. In one embodiment, sample control module 502 has a first input terminal configured to receive latch control signal LAT_S, a second input terminal configured to receive latch control signal LAT_SB, a first output terminal configured to provide sample control signal S_H, and a second output terminal configured to provide sample control signal S_L. In one embodiment, sampled signal SEN is being stored under control of sample control module 502.

Single-ended output module 505 is configured to provide output signal OUT based on sampled signal SEN. In one embodiment, single-ended output module 505 has a first input terminal coupled to the output terminal of balance module 501 to receive sampled signal SEN, a second input terminal configured to receive a hold control signal H_H, a third input terminal configured to receive a hold control signal H_L, a fourth input terminal configured to receive a default control signal D_H, a fifth input terminal configured to receive a default control signal D_L, and an output terminal configured to provide output signal OUT.

Hold control module 503 is configured to control sampled signal SEN being held based on latch control signal LAT_S and latch control signal LAT_SB, so that single-ended output module 505 is controlled to provide output signal OUT based on sampled signal SEN. In one embodiment, hold control module 503 comprises a first input terminal configured to receive latch control signal LAT_S, a second input terminal configured to receive latch control signal LAT_SB, a first output terminal configured to provide hold control signal H_H, and a second output terminal configured to provide hold control signal H_L.

Default setting module 504 is configured to set a default value of output signal OUT in accordance with set signal SET or reset signal RESET. In one embodiment, default setting module 504 has an input terminal configured to receive set signal SET or reset signal RESET, a first output terminal configured to provide default control signal D_H, and a second output terminal configured to provide default control signal D_L.

In the embodiment shown in FIG. 5, multi-time programmable non-volatile memory cell 500 has storage function and a function of flip and flop. And multi-time programmable non-volatile memory cell 500 has strong competitiveness when used in large array with different output logic design package for erasable, less silicon area, and simple and flexible extended structure. Besides, multi-time programmable non-volatile memory cell 500 has higher stability and reliability since no additional reference current signal is needed.

Figure 6:
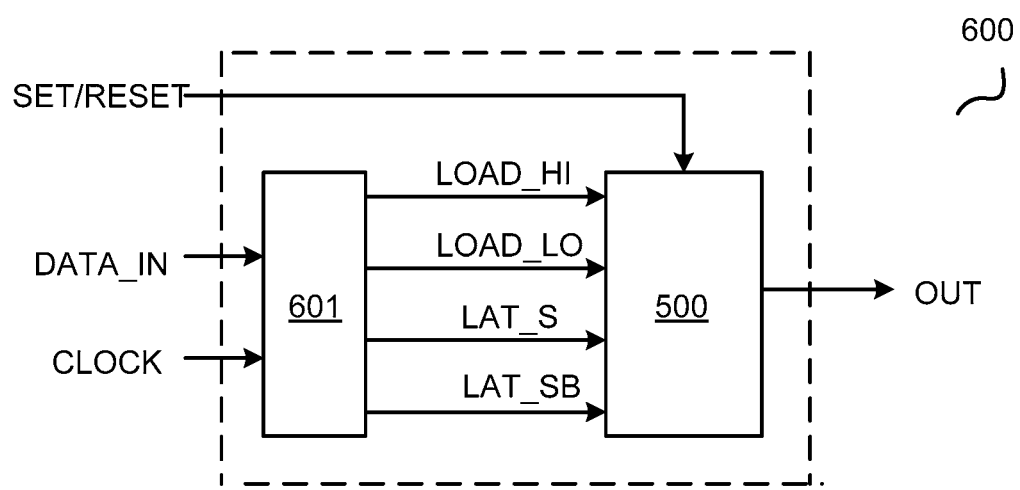
FIG. 6 schematically illustrates a circuit 600 employing multi-time programmable non-volatile memory cell 500 according to an embodiment of the present invention.

In one embodiment, multi-time programmable non-volatile memory cell 500 is compatible with timing sequence of D flip-flop. FIG. 6 schematically illustrates a circuit 600 employing multi-time programmable non-volatile memory cell 500 utilized as a D flip-flop according to an embodiment of the present invention. Circuit 600 comprises a logic array 601 and multi-time programmable non-volatile memory cell 500.

Logic array 601 receives a data signal DATA_IN and a clock signal CLOCK, provides load control signal LOAD_HI and load control signal LOAD_LO in accordance with data signal DATA_IN, and provides latch control signal LAT_S and latch control signal LAT_SB in accordance with clock signal CLOCK.

Multi-time programmable non-volatile memory cell 500 provides output signal OUT based on load control signal LOAD_HI, load control signal LOAD_LO, latch control signal LAT_S, latch control signal LAT_SB, and set signal SET or reset signal RESET. In one embodiment, when clock signal CLOCK is at a first status, e.g., a rising edge, then latch control signal LAT_S is at logic high, and latch control signal LAT_SB is at logic low, sampled signal SEN is being stored, sample control module 502 controls balance module 501 to achieve a first level latch, that is to provide sampled signal SEN by latching out balance signal B_HI and balance signal B_LO; and when clock signal is at a second status, e.g., a falling edge, then latch control signal LAT_S is at logic low, and latch control signal LAT_SB is at logic high, sample control module 502 controls sampled signal SEN being held, hold control module 503 controls single-ended output module 505 to achieve a second level latch, that is to provide output signal OUT by latching out sampled signal SEN. In one embodiment, when set signal SET or reset signal RESET is activated, defaulting setting module 504 controls single-ended output module 505 to provide output signal OUT equaling the default value, e.g., at logic high or at logic low.

Figure 7:
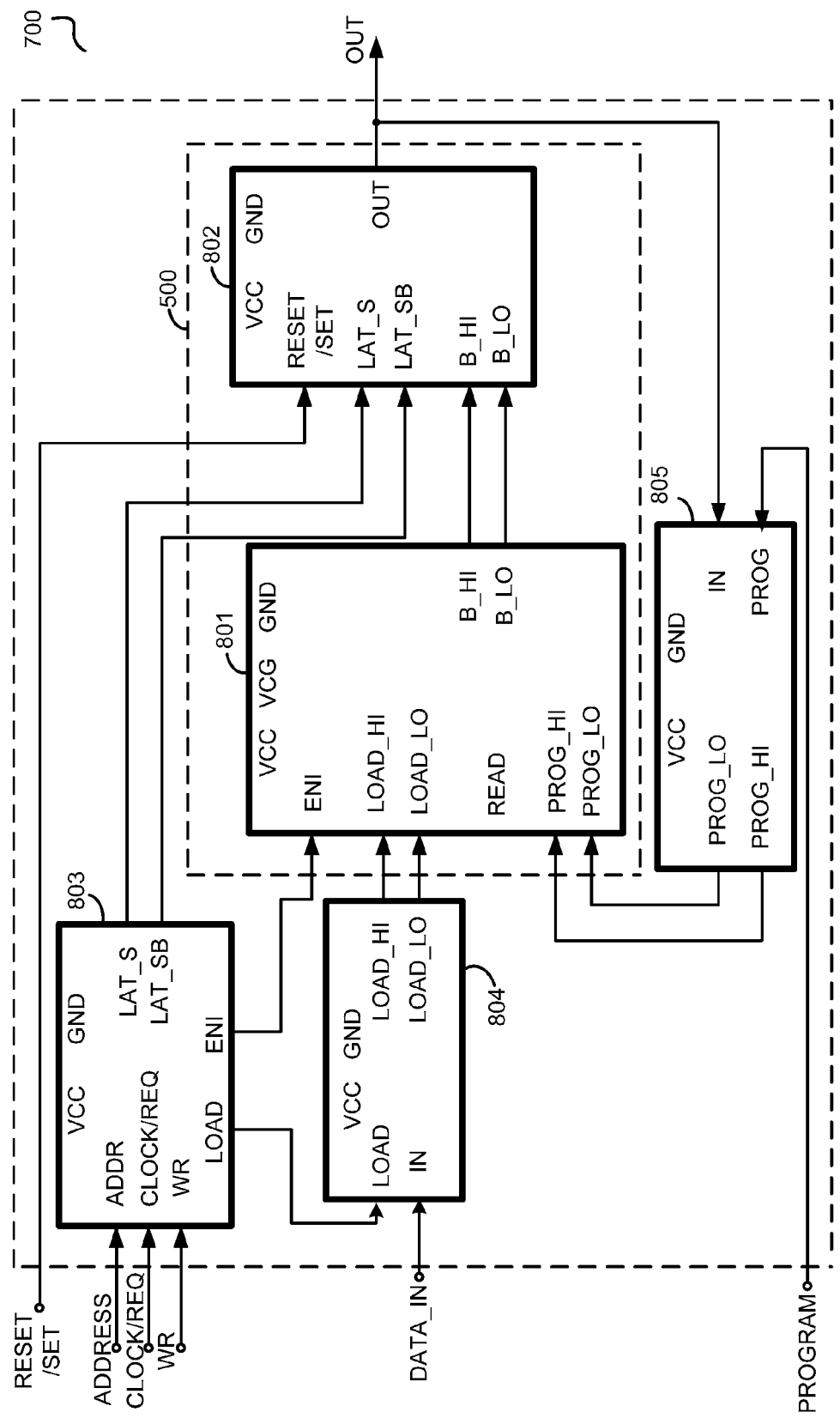
FIG. 7 schematically illustrates a circuit 700 employing multi-time programmable non-volatile memory cell 500 according to an embodiment of the present invention.

FIG. 7 schematically illustrates a circuit 700 employing multi-time programmable non-volatile memory cell 500 utilized as a register according to an embodiment of the present invention. Circuit 700 comprises multi-time programmable non-volatile memory cell 500, a sequence logic unit 803, a load logic unit 804, and a write logic unit 805, wherein multi-time programmable non-volatile memory cell 500 comprises differential MTP cell 801 and second-level latch cell 802 as shown in FIG. 5.

Sequence logic unit 803 provides a load enable signal LOAD, enable control signal ENI, latch control signal LAT_S, and latch control signal LAT_SB according to different application. In one embodiment, sequence logic unit 803 comprises a first input terminal configured to receive an address signal ADDRESS, a second input terminal configured to receive clock signal CLOCK or a request signal REQ, a third input terminal configured to receive a reading-and-writing enable signal WR, a first output terminal configured to provide latch control signal LAT_S, a second output terminal configured to provide latch control signal LAT_SB, a third output terminal configured to provide enable control signal ENI, and a fourth output terminal configured to provide load enable signal LOAD. In one embodiment, when circuit 700 is utilized as an asynchronous register, the second input terminal of sequence logic unit 803 is configured to receive request signal REQ. In another embodiment, when circuit 700 is utilized a synchronous register synchronous with clock signal CLOCK, the second input terminal of sequence logic unit 803 is configured to receive clock signal CLOCK. In one embodiment, sequence logic unit 803 further comprises a power terminal coupled to supply voltage VCC, and ground terminal coupled to logic ground GND.

Load logic unit 804 provides load control signal LOAD_HI and load control signal LOAD_LO based on load enable signal LOAD and data signal DATA_IN. In one embodiment, load logic unit 804 comprises a first input terminal coupled to sequence logic unit 803 to receive load enable signal LOAD, a second input terminal configured to receive data signal DATA_IN, a first output terminal, and a second output terminal, wherein when load enable signal LOAD is activated, the first output terminal of load logic unit 804 is configured to provide load control signal LOAD_HI and the second output terminal of load logic unit 804 is configured to provide load control signal LOAD_LO in accordance with data signal DATA_IN. In one embodiment, load logic unit 804 further comprises a power terminal coupled to supply voltage VCC, and a ground terminal coupled to logic ground GND.

Write logic unit 805 provides programming control signal PROG_HI and programming control signal PROG_LO based on a write signal PROGRAM and output signal OUT. In one embodiment, write logic unit 805 comprises a first input terminal configured to receive write signal PROGRAM, a second input terminal coupled to second-level latch cell 802 to receive output signal OUT, a first output terminal, and a second output terminal, wherein when write signal PROGRAM is activated, the first output terminal of write logic unit 805 is configured to provide programming control signal PROG_HI, and the second output terminal of write logic unit 805 is configured to provide programming control signal PROG_LO based on output signal OUT. In one embodiment, write logic unit 805 further comprises a power terminal coupled to supply voltage VCC, and a ground terminal coupled to logic ground GND.

Differential MTP cell 801 is coupled to sequence logic unit 803 to receive enable control signal ENI, coupled to load logic unit 804 to receive load control signal LOAD_HI and load control signal LOAD_LO, coupled to write logic unit 805 to receive programming control signal PROG_HI and programming control signal PROG_LO, and differential MTP cell 801 is configured to provide balance signal B_HI and balance signal B_LO based on enable control signal ENI, load control signal LOAD_HI, load control signal LOAD_LO, programming control signal PROG_HI, and programming control signal PROG_LO. In one embodiment, differential MTP cell 801 further receives read control signal READ, and provides balance signal B_HI and balance signal B_LO further based on read control signal READ. In one embodiment, differential MTP cell 801 further comprises a power terminal coupled to supply voltage VCC, and a ground terminal coupled to logic ground GND. In one embodiment, differential MTP cell 801 comprises memory module 101, write module 102, read module 103, latch module 105 or latch module 405, load module 106, and enable module 108 as shown in FIGS. 1-7.

Second-level latch cell 802 is coupled to differential MTP cell 801 to receive balance signal B_HI and balance signal B_LO, coupled to sequence logic unit 803 to receive latch control signal LAT_S and latch control signal LAT_SB, and is configured to provide output signal OUT based on a set signal SET or a reset signal RESET, balance signal B_HI, balance signal B_LO, latch control signal LAT_S, and latch control signal LAT_SB. In one embodiment, second-level latch cell 802 further comprises a power terminal coupled to supply voltage VCC, and a ground terminal coupled to logic ground GND.

Figure 8:
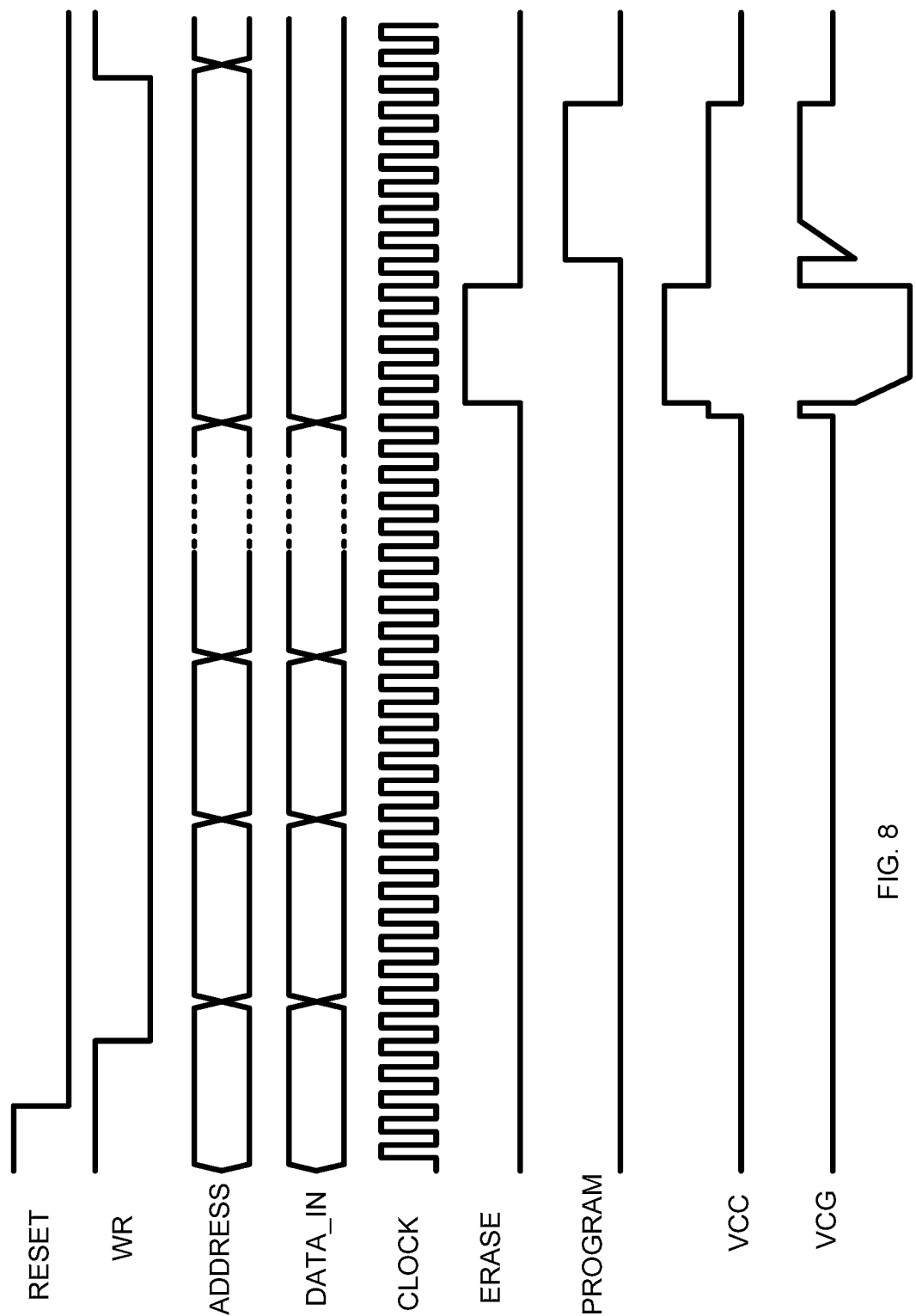
FIG. 8 illustrates a timing diagram of circuit 700 according to an embodiment of the present invention.

FIG. 8 illustrates a timing diagram of circuit 700 according to an embodiment of the present invention. Circuit 700 is compatible with timing sequence of a general register. In FIG. 8, waveforms shown from top to below are reset signal RESET, reading-and-writing enable signal WR, address signal ADDRESS, data signal DATA_IN, clock signal CLOCK, erase control signal ERASE, write signal PROGRAM, supply voltage VCC, and erase voltage VCG. As shown in FIG. 8, activated write signal PROGRAM (e.g., at logic high) is followed after activated erase signal ERASE (e.g., at logic high), that is the erase operation is executed before the write operation to erase data stored in multi-time programmable non-volatile memory cell 500. In the embodiment shown in FIG. 8, when erase control signal ERASE and write signal PROGRAM are respectively non-activated (e.g., at logic low), both supply voltage VCC and erase voltage VCG equal a standard supply voltage, e.g., 3.3V; when erase control signal ERASE becomes activated (e.g., at logic high), supply voltage VCC increases to twice a programming voltage, erase voltage VCG decreases to negative, thus a difference between supply voltage VCC and erase voltage VCG increases to erase the data stored in multi-time programmable non-volatile memory cell 500. When erase control signal ERASE becomes non-activated (e.g., at logic low) again, the erase operation is completed. And then write signal PROGRAM becomes activated (e.g., at logic high), both supply voltage VCC and erase voltage VCG equal the programming voltage which is higher than the standard supply voltage, and when write signal PROGRAM becomes non-activated (e.g., at logic low) again, both supply voltage VCC and erase voltage VCG resume to equal the standard supply voltage.

Figure 9:
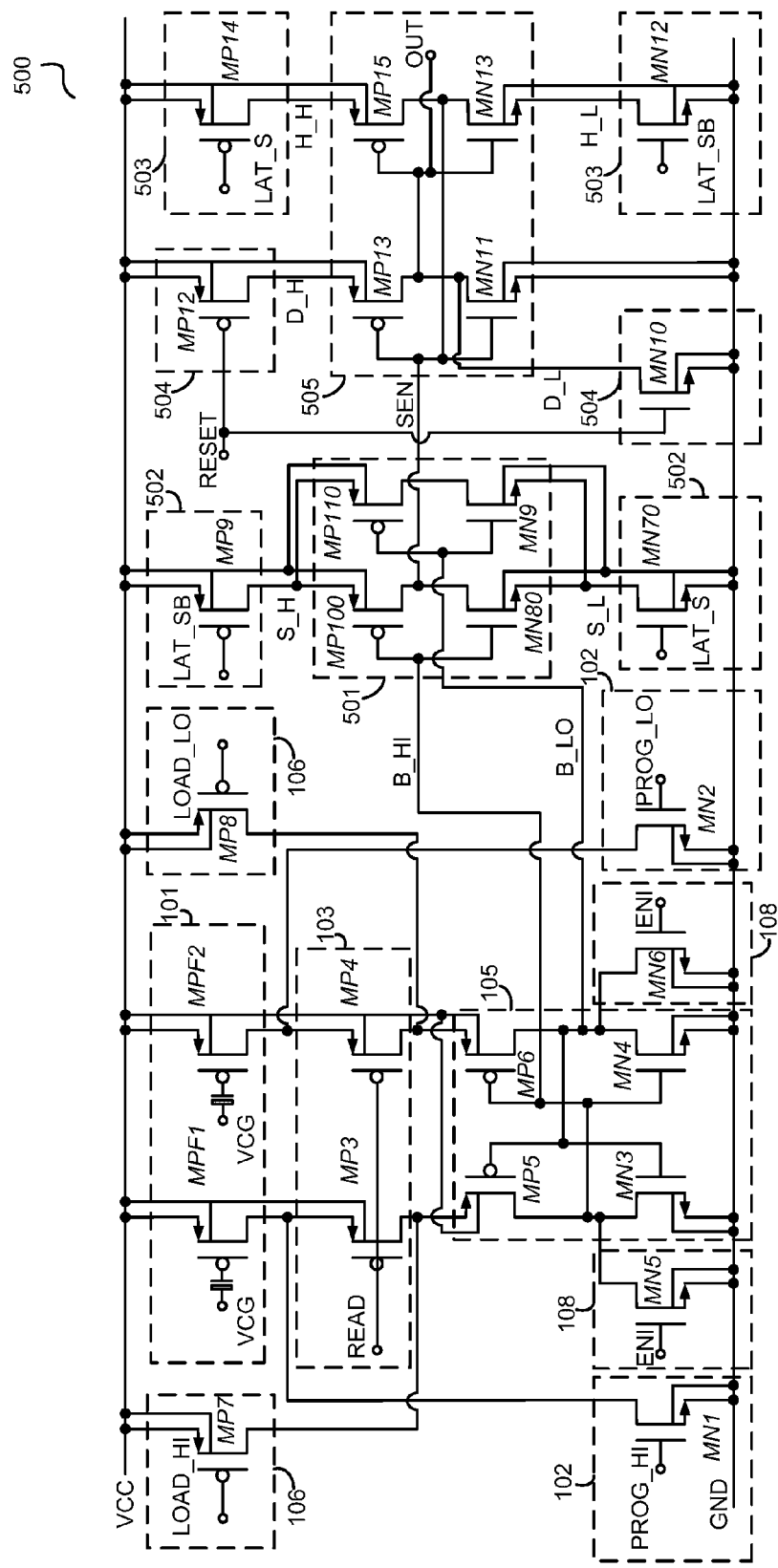
FIG. 9 schematically illustrates multi-time programmable non-volatile memory cell 500 according to an embodiment of the present invention.

FIG. 9 schematically illustrates multi-time programmable non-volatile memory cell 500 according to an embodiment of the present invention. In one embodiment, supply voltage VCC is used to power multi-time programmable non-volatile memory cell 500, and logic ground GND is used to provide ground reference for multi-time programmable non-volatile memory cell 500.

In one embodiment, balance module 501 comprises a complementary metal-oxide-semiconductor (CMOS) inverter comprising a PMOS MP100 and an NMOS MN80, and a CMOS inverter comprising a PMOS MP110 and an NMOS MN9. PMOS MP100, PMOS MP110, NMOS MN80 and NMOS MN9 have a drain, a source and a gate respectively. The gate of PMOS MP100 and the gate of NMOS MN80 are coupled together as the first input terminal of balance module 501 to receive balance signal B_HI, the gate of PMOS MP110 and the gate of NMOS MN9 are coupled together as the second input terminal of balance module 501 to receive balance signal B_LO, the source of PMOS MP100 and the source of PMOS MP110 are coupled together as the third input terminal of balance module 501 to receive sample control signal S_H, the drain of PMOS MP100 and the drain of NMOS MN80 are coupled together as the output terminal of balance module 501, the drain of PMOS MP110 is coupled to the drain of NMOS MN9, and the source of NMOS MN80 and the source of NMOS MN9 are coupled together as the fourth input terminal of balance module 501 to receive sample control signal S_L.

In one embodiment, sample control module 502 comprises a PMOS MP9 and a NMOS MN70, both PMOS MP9 and NMOS MN70 have a drain, a source and a gate respectively. The source of PMOS MP9 is coupled to supply voltage VCC, the gate of PMOS MP9 is utilized as the second input terminal of sample control module 502 to receive latch control signal LAT_SB, the drain of PMOS MP9 utilized as the first output terminal of sample control module 502 is coupled to the source of PMOS MP100 and the source of PMOS MP110 to provide sample control signal S_H, the source of NMOS MN70 is coupled to logic ground GND, the gate of NMOS MN70 utilized as the first input terminal of sample control module 502 is configured to receive latch control signal LAT_S, the drain of NMOS MN70 utilized as the second output terminal of sample control module 502 is coupled to the source of NMOS MN80 and the source of NMOS MN9 to provide sample control signal S_L.

In one embodiment, when latch control signal LAT_S is at logic high and logic control signal LAT_SB is at logic low, sample control module 502 operates to connect supply voltage VCC to the source of PMOS MP100 and the source of PMOS MP110 via turning ON PMOS MP9, and sample control module 502 operates to connect the source of NMOS MN80 and the source of NMOS MN9 to logic ground GND via turning ON NMOS MN70. Sampled signal SEN is being stored in response to balance signal B_HI and balance signal B_LO. In one embodiment, when balance signal B_HI is at logic low and balance signal B_LO is at logic high, PMOS MP100 is turned ON, NMOS MN80 is turned OFF, PMOS MP110 is turned OFF, NMOS MN9 is turned ON, and sampled signal SEN is being stored at logic high. In another embodiment, when balance signal B_HI is at logic high and balance signal B_LO is at logic low, PMOS MP100 is turned OFF, NMOS MN80 is turned ON, PMOS MP110 is turned ON, NMOS MN9 is turned OFF, and sampled signal SEN is being stored at logic low.

In one embodiment, hold control module 503 comprises a PMOS MP14 and an NMOS MN12, both PMOS MP14 and NMOS MN12 have a drain, a source, and a gate respectively. The source of PMOS MP14 is coupled to supply voltage VCC, the gate of PMOS MP14 utilized as the first input terminal of hold control module 503 is configured to receive latch control signal LAT_S, the drain of PMOS MP14 utilized as the first output terminal of hold control module 503 is configured to provide hold control signal H_H, the source of NMOS MN12 is coupled to the logic ground GND, the gate of NMOS MN12 utilized as the second input terminal of hold control module 503 is configured to receive latch control signal LAT_SB, and the drain of NMOS MN12 utilized as the second output terminal of hold control module 503 is configured to provide hold control signal H_L.

In one embodiment, when latch control signal LAT_S is at logic low and latch control signal LAT_SB is at logic high, sampled signal SEN is being held, that is sampled signal is not varied with balance signal B_HI and balance signal B_LO, hold control module 503 operates to connect a source of a PMOS MP15 to supply voltage VCC via turning ON PMOS MP14, and hold control module 503 operates to connect a source of an NMOS MN13 to logic ground GND. Output signal OUT is provided by single-ended output module 505 based on reset signal RESET and/or sampled signal SEN.

In one embodiment, default setting module 504 comprises a PMOS MP12 and an NMOS MN10, both PMOS MP12 and NMOS MN10 have a drain, a source and a gate respectively. The source of PMOS MP12 is coupled to supply voltage VCC, the gate of PMOS MP12 and the gate of NMOS MN10 utilized as the input terminal of default setting module 504 are coupled to receive reset signal RESET, the drain of PMOS MP12 utilized as the output terminal of default setting module 504 is configured to provide default control signal D_H, the source of NMOS MN10 is coupled to logic ground GND, and the drain of NMOS MN10 utilized as the second output terminal of default setting module 504 is configured to provide default control signal D_L.

In one embodiment, when reset signal RESET is at logic high, PMOS MP12 is turned OFF, NMOS MN10 is turned ON, default control signal D_L is at logic low, and output signal OUT is reset at logic low. In one embodiment, when reset signal RESET is at logic low, PMOS MP12 is turned ON, NMOS MN10 is turned OFF, default control signal D_H is at logic high, a source of a PMOS MP13 is coupled to supply voltage VCC, and output signal OUT is provided based on sampled signal SEN. For example, when sampled signal SEN is at logic high, NMOS MN110 is turned ON, PMOS MP13 is turned OFF, and output signal OUT is at logic low accordingly; and when sampled signal SEN is at logic low, NMOS MN110 is turned OFF, PMOS MP13 is turned ON, and output signal OUT is at logic high accordingly.

Single-ended output module 505 comprises a CMOS inverter comprising PMOS MP13 and an NMOS MN11, and a CMOS inverter comprising PMOS MP15 and NMOS MN13. PMOS MP13, PMOS MP15, NMOS MN13, and NMOS MN15 have a drain, a source and a gate respectively. The gate of PMOS MP13, the gate of NMOS MN11, the drain of PMOS MP15, and the drain of NMOS MN13 are coupled together as the first input terminal of single-ended output module 505 to receive sampled signal SEN, the source of PMOS MP13 utilized as the fourth input terminal of single-ended output module 505 is coupled to the drain of PMOS MP12 to receive default control signal D_H, the source of PMOS MP15 utilized as the second input terminal of single-ended output module 505 is coupled to the drain of PMOS MP14 to receive hold control signal H_H, the drain of PMOS MP13, the drain of NMOS MN11, the gate of PMOS MP15, and the gate of NMOS MN13 are coupled together as the fifth input terminal of single-ended output module 505 to receive default control signal D_L from the drain of NMOS MN10. The source of NMOS MN11 is coupled to logic ground GND, the source of NMOS MN13 utilized as the third input terminal of single-ended output module 505 is coupled to the drain of NMOS MN12 to receive hold control signal H_L. In the embodiment shown in FIG. 9, the drain of PMOS MP13, the drain of NMOS MN11, the gate of PMOS MP15, and the gate of NMOS MN13 are coupled as the output terminal of single-ended output module 505.

Figure 10:
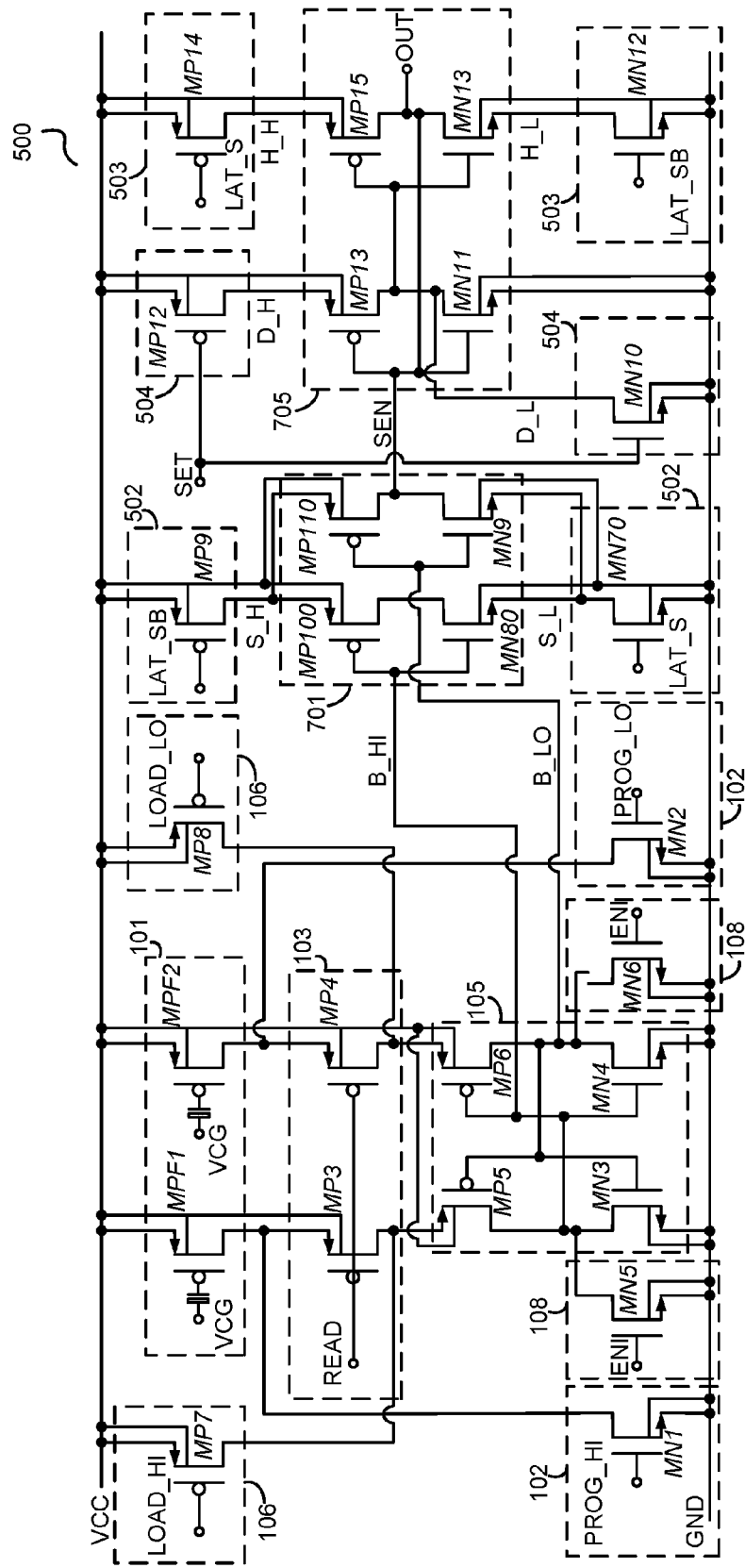
FIG. 10 schematically illustrates multi-time programmable non-volatile memory cell 500 according to another embodiment of the present invention.

FIG. 10 schematically illustrates multi-time programmable non-volatile memory cell 500 according to another embodiment of the present invention. The embodiment of FIG. 10 shows different balance module 701 and single-ended output module 705. In the embodiment shown in FIG. 9, default setting module 504 receives activated reset signal RESET to reset output signal OUT at logic low, and in the embodiment shown in FIG. 10, default setting module 504 receives activated set signal SET to set output signal OUT at logic high.

Balance module 701 comprises PMOS MP100, PMOS MP110, NMOS MN80, and NMOS MN9. Different with balance module 501, in the embodiment shown in FIG. 10, the drain of PMOS MP110 and the drain of NMOS MN9 are coupled together as an output terminal of balance module 701.

In one embodiment, when latch control signal LAT_S is at logic high and latch control signal LAT_SB is at logic low, \sample control module 502 operates to controlling balance module 701 to sample balance signal B_HI and balance signal B_LO via turning ON PMOS MP9 and turning ON NMOS MN70. In one embodiment, when balance signal B_HI is at logic low and balance signal B_LO is at logic high, PMOS MP100 and NMOS MN9 are turned ON, NMOS MN80 and PMOS MP110 are turned OFF, sampled signal SEN is being stored at logic low accordingly. In another embodiment, when balance signal B_HI is at logic high and balance signal B_LO is at logic low, PMOS MP100 and NMOS MN9 are turned OFF, NMOS MN80 and PMOS MP110 are turned ON, sampled signal SEN is being stored at logic high accordingly.

Single-ended output module 705 comprises PMOS MP13, PMOS MP15, NMOS MN11 and NMOS MN13. Different with single-ended output module 505, in the embodiment shown in FIG. 10, the drain of PMOS MP15 and the drain of NMOS MN13 are coupled together as an output terminal of single-ended output module 705.

In one embodiment, when latch control signal LAT_S is at logic low and latch control signal LAT_SB is at logic high, sampled signal SEN is being held under control of hold control module 503 via turning ON PMOS MP14 and turning ON NMOS MN12. Output signal OUT is provided based on set signal SET and/or sampled signal SEN. When set signal SET is at logic high, NMOS MN10 is turned ON, default control signal D_L is at logic low to turn ON PMOS MP15, and output signal OUT is at logic high accordingly. When set signal SET is at logic low, NMOS MN10 is turned OFF, single-ended output module 506 is configured to provide output signal OUT based on sampled signal SEN, for example, output signal OUT is at logic high when sampled signal SEN is being held at logic high, and output signal OUT is at logic low when sampled signal is being held at logic low.

It should be noted that "logic high" and "logic low" abovementioned may be substituted with each other since different logic circuit may have a same operation result.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A multi-time programmable memory cell, comprising:
a differential multi-time programmable memory cell, comprising a memory module configured to store a data, the differential multi-time programmable memory cell is configured to erase the data stored in the memory module via an erase operation, write the data into the memory module via a write operation, read out the data stored in the memory module and provide a first balance signal and a second balance signal accordingly via a read operation, and load a first load control signal and a second load control signal and provide the first balance signal and the second balance signal via a load operation; and
a second-level latch cell, coupled to the differential multi-time programmable memory cell to receive the first balance signal and the second balance signal, and the second-level latch cell is configured to provide an output signal based on the first balance signal, the second balance signal, a first latch control signal and a second latch control signal; wherein
the second-level latch cell is configured to generate a sampled signal via sampling the first balance signal and the second balance signal, and the second-level latch cell is configured to provide the output signal based on the sampled signal; and wherein
the sampled signal is being stored during when the first latch control signal is at a first state and the second latch control signal is at a second state, and the sampled signal is being held during when the first latch control signal is in the second state and the second latch control signal is in the first state.

2. The multi-time programmable memory cell of claim 1, wherein the second-level latch cell further comprises:
a sample control module, configured to receive the first latch control signal and the second latch control signal, and provide a first sample control signal and a second sample control signal in response to the first latch control signal and the second latch control signal; and
a balance module, coupled to the differential multi-time programmable memory cell to receive the first balance signal and the second balance signal, and coupled to the sample control module to receive the first sample control signal and the second sample control signal, and the balance module is configured to provide the sampled signal via sampling the first balance signal and the second balance signal under control of the first sample control signal and the second sample control signal.

3. The multi-time programmable memory cell of claim 2, wherein the balance module further comprises:
a first complementary metal-oxide-semiconductor (CMOS) inverter, comprising a first P-type metal oxide semiconductor field effect transistor (PMOS) and a first N-type metal oxide semiconductor field effect transistor (NMOS), both the first PMOS and the first NMOS have a drain, a source and a gate respectively, and the gate of the first PMOS and the gate of the first NMOS are coupled together to receive the first balance signal; and
a second CMOS inverter, comprising a second PMOS and a second NMOS, both the second PMOS and the second NMOS have a drain, a source and a gate respectively, and the gate of the second PMOS and the gate of the second NMOS are coupled together to receive the second balance signal; wherein
the source of the first PMOS and the source of the second PMOS are coupled together to receive the first sample control signal, and the source of the first NMOS and the source of the second NMOS are coupled together to receive the second sample control signal, the drain of the first PMOS is coupled to the drain of the first NMOS, the drain of the second PMOS is coupled to the drain of the second NMOS, and one of the drain of the first PMOS and the drain of the second PMOS is configured to provide the sampled signal.

4. The multi-time programmable memory cell of claim 2, wherein the sample control module further comprises:
a third PMOS, having a drain, a source and a gate, wherein the source of the third PMOS is coupled to a supply voltage, the gate of the third PMOS is configured to receive the second latch control signal, and the drain of the third PMOS is configured to provide the first sample control signal; and
a third NMOS, having a drain, a source and a gate, wherein the source of the third NMOS is coupled to a logic ground, the gate of the third NMOS is configured to receive the first latch control signal, and the drain of the third NMOS is configured to provide the second sample control signal.

5. The multi-time programmable memory cell of claim 2, wherein the second-level latch cell further comprises:
a hold control module, configured to receive the first latch control signal and the second latch control signal, and configured to provide a first hold control signal and a second hold control signal in response to the first latch control signal and the second latch control signal; and
a single-ended output module, configured to receive the sampled signal, the first hold control signal, and the second hold control signal, and provide the output signal in response to the sampled signal under control of the first latch control signal and the second latch control signal.

6. The multi-time programmable memory cell of claim 1, wherein the second-level latch cell further comprises:
a balance module, having a first input terminal configured to receive the first balance signal, a second input terminal configured to receive the second balance signal, a third input terminal, a fourth input terminal, and an output terminal configured to provide a sampled signal via sampling the first balance signal and the second balance signal when the first latch control signal is in the first state and the second latch control signal is in the second state; and
a single-ended output module, having a first input terminal coupled to the balance module to receive the sampled signal, a second input terminal, a third input terminal, a fourth input terminal, a fifth input terminal, and an output terminal configured to provide the output signal in response to the sampled signal when the first latch control signal is in the second state and the second latch control signal is in the first state.

7. The multi-time programmable memory cell of claim 6, wherein the balance module further comprises:
a first CMOS inverter, comprising a first PMOS and a first NMOS, both the first PMOS and the first NMOS have a drain, a source and a gate respectively, and the gate of the first PMOS and the gate of the first NMOS are coupled together to receive the first balance signal; and
a second CMOS inverter, comprising a second PMOS and a second NMOS, both the second PMOS and the second NMOS have a drain, a source and a gate respectively, and the gate of the second PMOS and the gate of the second NMOS are coupled together to receive the second balance signal; wherein
the source of the first PMOS and the source of the second PMOS are coupled together as the third input terminal of the balance module, the source of the first NMOS and the source of the second NMOS are coupled together as the fourth input terminal of the balance module, the drain of the first PMOS is coupled to the drain of the first NMOS, the drain of the second PMOS is coupled to the drain of the second NMOS, and one of the drain of the first PMOS and the drain of the second PMOS is configured as the output terminal of the balance module.

8. The multi-time programmable memory cell of claim 6, wherein the second-level latch cell further comprises:
a third PMOS, having a drain, a source and a gate, wherein the source of the third PMOS is coupled to a supply voltage, the gate of the third PMOS is configured to receive the second latch control signal, and the drain of the third PMOS is coupled to the third input terminal of the balance module; and
a third NMOS, having a drain, a source and a gate, wherein the source of the third NMOS is coupled to a logic ground, the gate of the third NMOS is configured to receive the first latch control signal, and the drain of the third NMOS is coupled to the fourth input terminal of the balance module.

9. The multi-time programmable memory cell of claim 6, wherein the single-ended output module further comprises:

a third CMOS inverter, comprising a fourth PMOS and a fourth NMOS, both the fourth PMOS and the fourth NMOS have a drain, a source and a gate respectively; and a fourth CMOS inverter, comprising a fifth PMOS and a fifth NMOS, both the fifth PMOS and the fifth NMOS have a drain, a source and a gate respectively; wherein the gate of the fourth PMOS, the gate of the fourth NMOS, the drain of the fifth PMOS, and the drain of the fifth NMOS are coupled together as the first input terminal of the single-ended output module, the source of the fourth PMOS is configured as the fourth input terminal of the single-ended output module, the source of the fifth PMOS is configured as the second input terminal of the single-ended output module, the drain of the fourth PMOS, the drain of the fourth NMOS, the gate of the fifth PMOS, and the gate of the fifth NMOS are coupled together as the fifth input terminal of the single-ended output module, the source of the fourth NMOS is coupled to a logic ground, the source of the fifth NMOS is configured as the third input terminal of the single-ended output module, and one of the gate of the fifth PMOS and the drain of the fifth PMOS is configured as the output terminal of the single-ended output module.

10. The multi-time programmable memory cell of claim 6, wherein the second-level latch cell further comprises:
a sixth PMOS, having a drain, a source and a gate, wherein the source of the sixth PMOS is coupled to a supply voltage, the gate of the sixth PMOS is configured to receive the first latch control signal, and the drain of the sixth PMOS is coupled to the second input terminal of the single-ended output module; and
a sixth NMOS, having a drain, a source and a gate, wherein the source of the sixth NMOS is coupled to a logic ground, the gate of the sixth NMOS is configured to receive the second latch control signal, and the drain of the sixth NMOS is coupled to the third input terminal of the single-ended output module.

11. The multi-time programmable memory cell of claim 6, wherein the second-level latch cell further comprises:
a default setting module, having an input terminal configured to receive a set signal or a reset signal, a first output terminal coupled to the fourth input terminal of the single-ended output module, and a second output terminal coupled to the fifth input terminal of the single-ended output module, wherein the default setting module is configured to control a default value of the output signal based on the set signal or the reset signal.

12. A multi-time programmable memory cell, comprising:
a memory module, configured to store a data with a multi-time programmable capability;
an erase module, configured to erase the data stored in the memory module based on an erase control signal;
a write module, configured to store a first programming signal and a second programming signal into the memory module in accordance with a first programming control signal and a second programming control signal, wherein the first programming control signal and the second programming control signal are logically complementary, and the first programming signal and the second programming signal are logically complementary;
a read module, configured to read out the data stored in the memory module and provide a first read signal and a second read signal accordingly based on a read control signal, wherein the first read signal and the second read signal are logically complementary;
a load module, configured to provide a first load signal and a second load signal according to a first load control signal and a second load control signal, wherein the first load control signal and the second load control signal are logically complementary, and the first load signal and the second load signal are logically complementary;
a latch module, configured to provide a first balance signal and a second balance signal in response in part to the first read signal and the second read signal, and in response in part to the first load signal and the second load signal;
a balance module, configured to sample the first balance signal and the second balance signal and provide a sampled signal in response to the first balance signal and the second balance signal, wherein the sampled signal is being stored during when a first latch control signal is at a first state and the second latch control signal is at a second state, and wherein the sampled signal is being held during when the first latch control signal is in the second state and the second latch control signal is in the first state; and
a single-ended output module, configured to provide an output signal in response to the sampled signal.

13. The multi-time programmable memory cell of claim 12, wherein the memory module further comprises:
a first floating gate avalanche-injection metal-oxide semiconductor (FAMOS), having a source, a drain and a floating gate, wherein the drain of the first FAMOS is configured to receive the first programming signal, and the drain of the first FAMOS is configured to provide the first read signal through the read module when the read control signal is activated;
a first erase capacitor, having a first terminal and a second terminal, wherein the first terminal is coupled to the floating gate of the first FAMOS, and the second terminal is coupled to an erase voltage;
a second FAMOS, having a source, a drain and a floating gate, wherein the drain of the second FAMOS is configured to receive the second programming signal, the drain of the second FAMOS is configured to provide the second read signal through the read module when the read control signal is activated, and the source of the second FAMOS and the source of the first FAMOS are coupled to a supply voltage; and
a second erase capacitor, having a first terminal and a second terminal, wherein the first terminal is coupled to the floating gate of the second FAMOS, and the second terminal is coupled to the erase voltage.

14. The multi-time programmable memory cell of claim 12, wherein the balance module further comprises:
a first CMOS inverter, having a first PMOS and a first NMOS, both the first PMOS and the first NMOS have a drain, a source and a gate respectively, wherein the gate of the first PMOS and the gate of the first NMOS are coupled to receive the first balance signal, and the drain of the first PMOS and the drain of the first NMOS are coupled to provide the sampled signal; and
a second CMOS inverter, having a second PMOS and a second NMOS, both the second PMOS and the second NMOS have a drain, a source and a gate respectively, wherein the gate of the second PMOS and the gate of the second NMOS are coupled to receive the second balance signal; wherein when the first latch control signal is in the first state, the source of the first NMOS and the source of the second NMOS are coupled to a logic ground; and wherein when the second latch control signal is in the second state, the source of the first PMOS and the source of the second PMOS are coupled to a supply voltage.

15. The multi-time programmable memory cell of claim 12, wherein the balance module further comprises:
a first CMOS inverter, having a first PMOS and a first NMOS, both the first PMOS and the first NMOS have a drain, a source and a gate respectively, wherein the gate of the first PMOS and the gate of the first NMOS are coupled to receive the first balance signal; and
a second CMOS inverter, having a second PMOS and a second NMOS, both the second PMOS and the second NMOS have a drain, a source and a gate respectively, wherein the gate of the second PMOS and the gate of the second NMOS are coupled to receive the second balance signal, and the drain of the second PMOS and the drain of the second NMOS are coupled to provide the sampled signal; wherein when the first latch control signal is in the first state, the source of the first NMOS and the source of the second NMOS are coupled to a logic ground; and wherein when the second latch control signal is in the second state, the source of the first PMOS and the source of the second PMOS are coupled to a supply voltage.

16. The multi-time programmable memory cell of claim 12, wherein the single-ended output module further comprises:
a third CMOS inverter, having a third PMOS and a third NMOS, both the third PMOS and the third NMOS have a drain, a source and a gate respectively; and
a fourth CMOS inverter, having a fourth PMOS and a fourth NMOS, both the fourth PMOS and the fourth NMOS have a drain, a source and a gate respectively; wherein
the gate of the third PMOS, the gate of the third NMOS, the drain of the fourth PMOS and the drain of the fourth NMOS are coupled to receive the sampled signal, the drain of the third PMOS, the drain of the third NMOS, the gate of the fourth PMOS, and the gate of the fourth NMOS are coupled to provide the output signal, and the source of the third NMOS is coupled to a logic ground;
when the first latch control signal is in the second state, the source of the fourth PMOS is coupled to a supply voltage;
when the second latch control signal is in the first state, the source of the fourth NMOS is coupled to the logic ground; and wherein
the multi-time programmable memory cell is further configured to receive a reset signal, the output signal is reset to low when the reset signal is activated, and the source of the third PMOS is coupled to the supply voltage when the reset signal is non-activated.

17. The multi-time programmable memory cell of claim 12, wherein the single-ended output module further comprises:
a third CMOS inverter, having a third PMOS and a third NMOS, both the third PMOS and the third NMOS have a drain, a source and a gate respectively; and
a fourth CMOS inverter, having a fourth PMOS and a fourth NMOS, both the fourth PMOS and the fourth NMOS have a drain, a source and a gate respectively; wherein
the gate of the third PMOS, the gate of the third NMOS, the drain of the third PMOS, and the drain of the third NMOS are coupled to receive the sampled signal and provide the output signal meanwhile, the drain of the third PMOS, the drain of the third NMOS, the gate of the fourth PMOS, and the gate of the fourth NMOS are coupled together, and the source of the third NMOS is coupled to a logic ground;
the source of the fourth PMOS are coupled to a supply voltage when the first latch control signal is in the second state;
the source of the fourth NMOS are coupled to the logic ground when the second latch control signal is in the first state; and wherein
the multi-time programmable memory cell is further configured to receive a set signal, the output signal is set to high when the set signal is activated, and the source of the third PMOS is coupled to the supply voltage when the set signal is non-activated.

18. A circuit configured to achieve a function of a D flip-flop, comprising:
a logic array, configured to receive a data signal and a clock signal, provide a first load control signal and a second load control signal based on the data signal, and provide a first latch control signal and a second latch control signal based on the clock signal;
a differential multi-time programmable memory cell, coupled to the logic array to receive the first load control signal and the second load control signal, the differential multi-time programmable memory cell is configured to provide a first balance signal and a second balance signal in response to the first load control signal and the second load control signal via a load operation; and
a second-level latch cell, coupled to the differential multi-time programmable memory cell to receive the first balance signal and the second balance signal, coupled to the logic array to receive the first latch control signal and the second latch control signal, configured to generate a sampled signal in response to the first balance signal and the second balance signal, and configured to provide an output signal in response to the sampled signal; wherein
the sampled signal is being stored during when the first latch control signal is at a first state and the second latch control signal is at a second state; and wherein
the sampled signal is being held during when the first latch control signal is in the second state and the first latch control signal is in the first state.

19. A circuit configured to achieve a function of a register, comprising:
a sequence logic unit, configured to receive an address signal, a first signal comprising one of a clock signal and a request signal, and a reading-and-writing enable signal, and is configured to provide an enable control signal, a first latch control signal, a second latch control signal and a load enable signal based on the address signal, the first signal, and the reading-and-writing enable signal;
a load logic unit, coupled to the sequence logic unit to receive the load enable signal and configured to receive a data signal, the load logic unit is configured to provide a first load control signal and a second load control signal based on the load enable signal and the data signal;
a write logic unit, configured to receive a write signal and an output signal, and provide a first programming control signal and a second programming control signal based on the write signal and the output signal;

a differential multi-time programmable memory cell, coupled to the sequence logic unit to receive the enable control signal, coupled to the load logic unit to receive the first load control signal and the second load control signal, coupled to the write logic unit to receive the first programming control signal and the second programming control signal, and the differential multi-time programmable memory cell is configured to provide a first balance signal and a second balance signal based on the enable control signal, the first load control signal, the second load control signal, the first programming control signal, and the second programming signal, wherein the differential multi-time programmable memory cell is capable to erase a stored data via an erase operation, store the data in response to the first programming control signal and the second programming control signal via a write operation, read out the stored data and provide the first balance signal and the second balance signal accordingly via a read operation, and load the first load control signal and the second load control signal and provide the first balance signal and the second balance signal accordingly via a load operation; and a second-level latch cell, coupled to the differential multi-time programmable memory cell to receive the first balance signal and the second balance signal, coupled to the sequence logic unit to receive the first latch control signal and the second latch control signal, configured to generate a sampled signal in response to the first balance signal and the second balance signal, and configured to provide the output signal based on the sampled signal; wherein the sampled signal is being stored during when the first latch control signal is at a first state and the second latch control signal is at a second state; and wherein the sampled signal is being held during when the first latch control signal is in the second state and the first latch control signal is in the first state.

* * * * *